United States Patent
Kitano

(10) Patent No.: US 7,856,610 B2
(45) Date of Patent: Dec. 21, 2010

(54) METHOD AND APPARATUS FOR SEMICONDUCTOR INTEGRATED CIRCUIT

(75) Inventor: Tomohiro Kitano, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 260 days.

(21) Appl. No.: 11/800,647

(22) Filed: May 7, 2007

(65) Prior Publication Data

US 2007/0276643 A1 Nov. 29, 2007

(30) Foreign Application Priority Data

May 10, 2006 (JP) .............................. 2006/130982

(51) Int. Cl.
*G06F 17/50* (2006.01)
(52) U.S. Cl. .......................................... 716/13; 716/12
(58) Field of Classification Search .............. 716/10–14
See application file for complete search history.

(56) References Cited

U.S. PATENT DOCUMENTS

| 4,903,214 | A | * | 2/1990 | Hiwatashi | .................... | 716/14 |
| 5,375,069 | A | * | 12/1994 | Satoh et al. | ..................... | 716/14 |
| 5,872,719 | A | * | 2/1999 | Miyazaki et al. | .............. | 716/12 |
| 6,473,891 | B1 | * | 10/2002 | Shively | ........................ | 716/12 |

FOREIGN PATENT DOCUMENTS

| JP | SHO 60-140843 | 7/1985 |
| JP | HEI 04-269860 | 9/1992 |
| JP | HEI 04-291744 | 10/1992 |
| JP | 06-163696 | 6/1994 |
| JP | 11-067926 | 3/1999 |
| JP | HEI 11-097541 | 4/1999 |
| JP | 2000-216252 | 8/2000 |
| JP | 2000-349160 | 12/2000 |
| JP | 2003-016126 | 1/2003 |
| JP | 2003-332431 | 11/2003 |
| JP | HEI 06-232263 | 8/2004 |

* cited by examiner

*Primary Examiner*—Jack Chiang
*Assistant Examiner*—Binh C Tat
(74) *Attorney, Agent, or Firm*—Scully, Scott, Murphy & Presser, P.C.

(57) ABSTRACT

A design method for a semiconductor integrated circuit includes a first step (S13) of grouping pins that configure a same net into a plurality of groups; a second step (S14) of defining sub-trunk wirings mutually connecting the pins that belong to a same group; a third step (S16) of defining a main trunk wiring substantially parallel to the sub-trunk wirings; and a fourth step (S17) of defining a lead-in wiring connecting at least the main trunk wiring and the sub-trunk wirings. Thus, a plurality of pins are grouped, and the groups are mutually connected by the sub-trunk wirings, making it possible to decrease the number of the lead-in wirings. Thereby, even when the number of nets is large relative to the area of a layout region, a probability of occurrence of nets where automatic wiring is impossible can be greatly reduced.

19 Claims, 17 Drawing Sheets

METHOD AND APPARATUS FOR SEMICONDUCTOR INTEGRATED CIRCUIT

TECHNICAL FIELD

The present invention relates to a design method and apparatus for a semiconductor integrated circuit, and, more particularly to a design method and apparatus for performing automatic wiring in a predetermined layout region.

BACKGROUND OF THE INVENTION

In designing semiconductor integrated circuits, it is a general practice to design positions of wirings for connecting circuit blocks by using an automatic wiring tool. An algorithm for determining the wiring positions differs depending on each automatic wiring tool. However, as far as connection is concerned, known methods are: a trunk wiring of each net is firstly defined; a lead-in wiring that connects the trunk wiring and input/output pins is then defined; and the input pins and the output pins are thereby mutually connected by each net.

FIG. 17 is a flowchart for explaining an automatic wiring method by the conventional algorithm described above. FIG. 18 to FIG. 20 are schematic diagrams showing layout regions to be automatically wired.

In this example, as shown in FIG. 18, an explanation is given of a case, as an example, where out of a plurality of circuit blocks 12a and 12b formed within a layout region 10, an output pin 14 of the circuit block 12a is connected to an input pin 16 of the circuit block 12b. In this case, although other nets exist within the layout region 10, the explanation is given by focusing on only a net comprised of the output pin 14 of the circuit block 12a and the input pins 16 of the circuit blocks 12b for the sake of greater clearness.

Firstly, X coordinates and Y coordinates of the output pin 14 and the input pins 16 existing within the layout region 10 are obtained (step S1). As shown in FIG. 18, the net is constituted of one output pin 14 and a plurality of (14 in total) input pins 16. That is, the net serves to commonly supply an output signal of the circuit block 12a as an input signal of 14 circuit blocks 12b.

Subsequently, the average value of the Y coordinates of all pins 14 and 16 is calculated, and the obtained Y coordinate is determined as a Y coordinate 20y of the trunk wiring (step S2). Out of the X coordinates of all pins 14 and 16, an X coordinate of which value is the minimum (positioned at the leftmost) and an X coordinate of which value is the maximum (positioned at the rightmost) are selected, and the selected values are determined as X coordinates 20xl and 20xr of ends of the trunk wiring (step S3).

In practice, this process (steps S1 to S3) is performed on a plurality of nets. Thus, intervals between the trunk wirings that correspond to each net are sometimes too narrow, and in some cases, the trunk wirings are positioned to be short-circuited. In this case, the Y coordinates of some trunk wirings are increased or decreased for fine adjustment.

The position of the trunk wiring is thus established. According thereto, a trunk wiring 20 is hypothetically wired based on the determined XY coordinates, as shown in FIG. 19 (step S4). It is noted that the term "hypothetically" used herein means that the wiring is not performed on an actual device, and the wiring position is merely established in the automatic wiring tool.

Subsequently, as shown in FIG. 20, lead-in wirings 22 and 24 that connect all the pins 14, 16 and the trunk wiring 20 are hypothetically wired in the X direction (step S5). A wiring width of the lead-in wiring 22 connected to the output pin 14 is set to be sufficiently large. The reason for this is that since one output pin 14 is connected to a number of input pins 16, a resistance value of the lead-in wiring 22 connected to the output pin 14 needs to be sufficiently low as compared to the lead-in wirings 24 connected to the input pins 16.

This completes the automatic wiring of the net. As explained above, in practice, the process (steps S1 to S5) is performed on the plurality of nets, and thereby, the automatic wirings for all the nets within the layout region 10 are completed.

Regarding the technique relating to the automatic wiring of semiconductor integrated circuits, techniques described in Japanese Patent Application Laid Open Nos. 2003-16126, H11-67926, 2000-349160, H6-163696, 2003-332431, and 2000-216252 are known, for example.

However, in the conventional automatic wiring method, the lead-in wirings 22 and 24 including a substantially equivalent number of pins 14 and 16 to be connected are needed. This does not lead to a serious problem in the case where the number of nets is small relative to the area of the layout region 10. However, in the case where the number of nets is large relative to the area of the layout region 10, in other words, when the area of the layout region 10 is narrow relative to the number of nets, the conventional case sometimes causes occurrence of a net where the automatic wiring is impossible.

Semiconductor integrated circuits of which area of the layout region 10 is relatively narrow relative to the number of nets include a semiconductor memory such as DRAM (Dynamic Random Access Memory). This is due to the fact that in the semiconductor memory, most of the area is used as a memory cell region, and strong demands for reduction in cost lead to a multiple-layered structure, thereby making it difficult to form a wiring region on the memory cell region. Thus, in the semiconductor memory, there is no other choice but to perform wiring between the circuit blocks that configure peripheral circuits such as a decoder within a narrow peripheral circuit range. As a result, when the conventional automatic wiring tool is used, a net where the automatic wiring is impossible is often generated.

It is therefore an object of the present invention to provide an improved design method and apparatus for a semiconductor integrated circuit.

Another object of the present invention is to provide a design method and apparatus for a semiconductor integrated circuit, capable of reducing the number of lead-in wirings.

Still another object of the present invention is to provide a design method and apparatus suitable for automatically wiring a peripheral circuit region of a semiconductor memory.

SUMMARY OF THE INVENTION

The above and other objects of the present invention can be accomplished by a design method for a semiconductor integrated circuit, comprising:

a first step of grouping first pins included in a same net into a plurality of groups;

a second step of defining sub-trunk wirings mutually connecting the first pins that belong to a same group;

a third step of defining a main trunk wiring substantially parallel to the sub-trunk wirings; and a fourth step of defining first lead-in wirings connecting at least the main trunk wiring and the sub-trunk wirings.

Since the first to fourth steps do not define any time order, the third step can be performed before the first and second steps, for example.

The above and other objects of the present invention can also be accomplished by a design apparatus for a semiconductor integrated circuit, comprising:

a coordinate obtaining unit that obtains coordinates of a plurality of pins included in a same net;

a grouping unit that groups the plurality of pins;

a first wiring-position computing unit that determines positions of sub-trunk wirings mutually connecting the pins that belong to a same group;

a second wiring-position computing unit that determines a position of a main trunk wiring substantially parallel to the sub-trunk wirings; and a third wiring-position computing unit that determines a position of lead-in wirings connecting the main trunk wiring and the sub-trunk wirings.

It is not necessary that each of the units is a physically independent element. Accordingly, one device or mechanism can physically configure two or more units. On the contrary, one unit can be physically configured by two or more devices or mechanisms. Further, each of the units does not need to be a physical device or mechanism, and can be a function realized by having a computer executed a predetermined program.

According to the present invention, a plurality of pins are grouped, and these groups are mutually connected by the sub-trunk wirings, thereby making it possible to decrease the number of the lead-in wirings. In this manner, even when the number of nets is large relative to the area of a layout region, the possibility of generating nets where automatic wiring is impossible can be greatly reduced. Accordingly, it becomes possible to efficiently perform automatic wiring even on a circuit of which layout region is small in area, and where multiple-layering of a wiring region is difficult, like a peripheral circuit of a semiconductor memory.

According to the present invention, the total wiring length is shortened as compared to the conventional case. Thus, it becomes also possible to reduce a wiring capacity.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
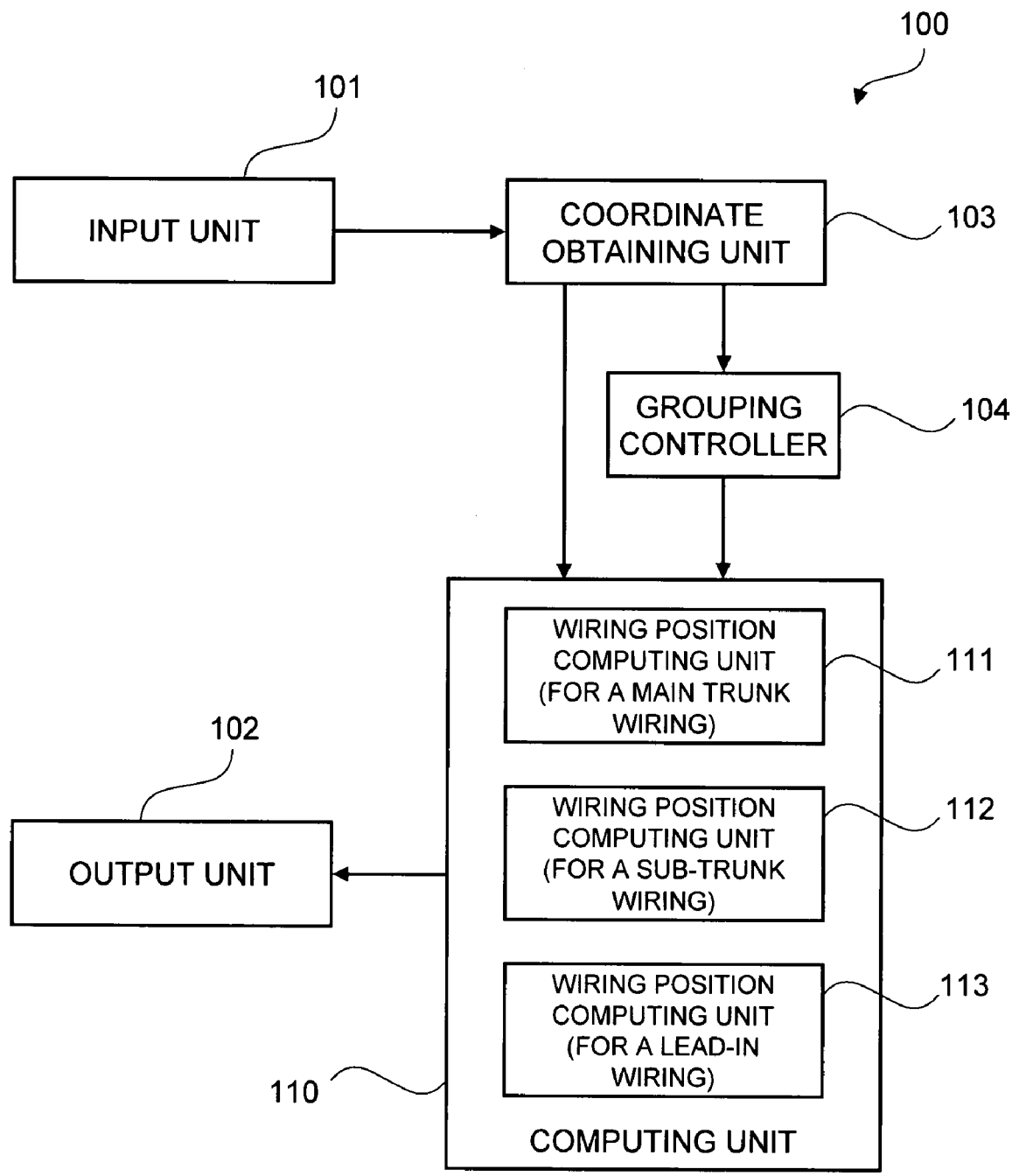
FIG. 1 is a block diagram showing a configuration of a design apparatus for a semiconductor integrated circuit according to a preferred embodiment of the present invention.

FIG. 1 is a block diagram showing a configuration of a design apparatus for a semiconductor integrated circuit according to a preferred embodiment of the present invention.

A design apparatus 100 according to the present embodiment is an apparatus (automatic wiring tool) that performs automatic wiring within a predetermined layout region. When X coordinates and Y coordinates of an output pin and input pins that belong to the same net are inputted in an input unit 101, data indicative of a wiring position of the net is outputted from an output unit 102. Each element configuring the design apparatus 100 does not need to be physically independent, and can be a function realized by having a computer executed a predetermined program.

Coordinates of pins to be automatically wired are inputted via the input unit 101, and temporarily stored in a coordinate obtaining unit 103. The coordinates stored in the coordinate obtaining unit 103 are supplied to a grouping controller 104 and a computing unit 110 thereby to determine positions of trunk wirings and lead-in wirings.

In the present invention, the trunk wirings are classified into a "main trunk wiring" and a "sub-trunk wiring". As shown in FIG. 1, the computing unit 110 includes a wiring position computing unit 111 for a main trunk wiring, a wiring position computing unit 112 for a sub-trunk wiring, and a wiring position computing unit 113 for a lead-in wiring. Positions of the main trunk wiring, the sub-trunk wiring, and the lead-in wiring are calculated by computation of the corresponding wiring position computing units 111 to 113.

Hereinafter, an operation of the design apparatus 100, that is, a design method for a semiconductor integrated circuit according to the present embodiment, is explained with reference to a flowchart.

Figure 2:
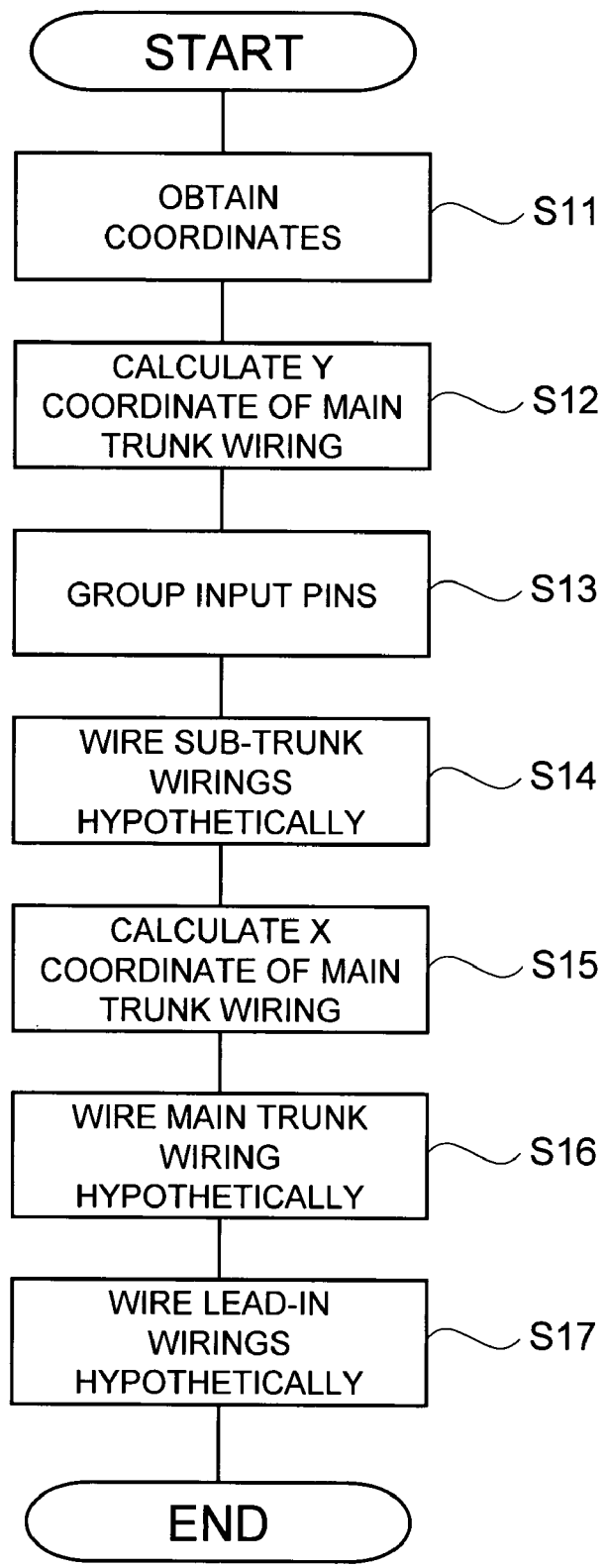
FIG. 2 is a flowchart showing the operation of the design apparatus shown in FIG. 1.

FIG. 2 is a flowchart showing the operation of the design apparatus 100. FIG. 3 to FIG. 6 are schematic diagrams showing one example of a layout region 10 to be automatically wired.

Figure 3:
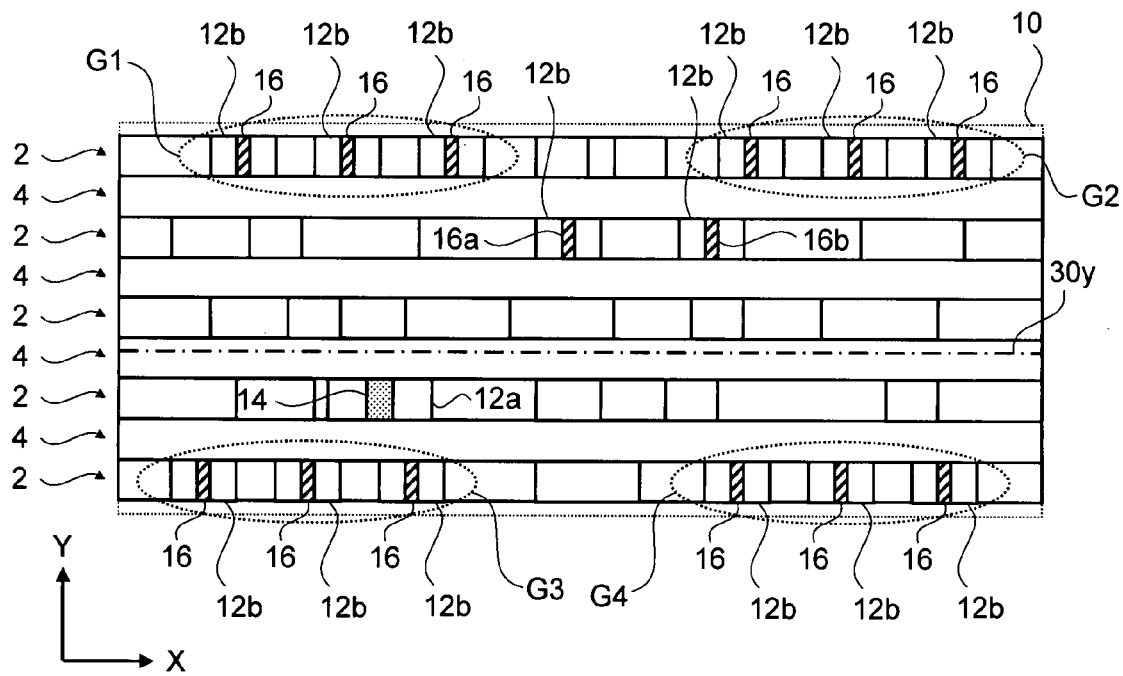
FIG. 3 is a schematic diagram showing a layout region to be automatically wired (a state before wiring)

As shown in FIG. 3, the configuration of the layout region 10 is almost same as that of the layout region 10 shown as an example in the description of the related art. Accordingly, out of a plurality of circuit blocks 12a and 12b formed within the layout region 10, an output pin 14 of the circuit block 12a and input pins 16 of the circuit block 12b belong to the same net. The design apparatus 100 automatically calculates positions of wirings that mutually connect the pins 14 and 16 that belong to the same net.

The layout region 10 includes circuit areas 2 where a plurality of circuit blocks 12a and 12b exist in the X direction in a strip shape, and auxiliary areas 4 sandwiched by these strip-shaped circuit areas 2. The auxiliary areas 4 are vacant areas where circuits such as a transistor are not formed in the initial stage of a circuit design, and after the circuit design is developed, circuits are optionally added in these auxiliary areas 4. However, the wirings for which the design apparatus 100 according to the present embodiment intends include wirings of a wiring layer positioned higher than a transistor level. Thus, the wirings can be formed in the both circuit areas 2 and the auxiliary areas 4.

As explained above, a large number of other nets exist within the layout region 10. However, the explanation is given by focusing on only a net comprised of the output pin 14 of the circuit block 12a and the input pins 16 of the circuit blocks 12b for the sake of greater clearness.

Firstly, X coordinates and Y coordinates of the output pin 14 and the input pins 16 existing within the layout region 10 are obtained via the input unit 101 (step S11). The obtained coordinates are stored in a coordinate obtaining unit 103. As shown in FIG. 3, the net is configured by one output pin 14 and a plurality of (14 in total) input pins 16.

Subsequently, by the wiring position computing unit 111 for a main trunk wiring calculates the average value of the Y coordinates by taking into account weighting specified for each pin 14 and 16, the obtained Y coordinate is determined as a Y coordinate 30y of the main trunk wiring (step S12). The weighting is set such that the output pin 14 rather than the input pins 16 applies a greater influence to the average value of the Y coordinates. Although not particularly limited, it is preferable that the output pin 14 be imparted with the weighting of an approximately equivalent number of input pins 16. In this example, since the number of input pins 16 is 14, weighting of about 14 times as large as that of the input pins 16 can be applied to the output pin 14. Thereby, the Y coordinate 30y calculated by the wiring position computing unit 111 is brought closer to the output pin 14 as much as possible. A specific value of the weighting can be supplied via the input unit 101, or a constant value inside the wiring position computing unit 111 can be used therefor. Alternately, the weighting can be automatically calculated by the wiring position computing unit 111 based on the number of input pins 16, for example.

Subsequently, by the grouping controller 104, the input pins 16 that exist close to each other are grouped. That is, the input pins 16 are classified into a plurality of groups (step S13). It is preferable that as the rule for grouping, the input pins 16 that have the equal Y coordinates and have mutual distances closer than distances to the Y coordinate 30y of the main trunk wiring be classified into the same group. The application of such a rule forms four groups G1 to G4 as shown in FIG. 3. The input pins 16a and 16b positioned at the approximate center are not grouped, because although the Y coordinates are equal with each other, the distance therebetween is farther than the distances to the main trunk wiring. Accordingly, these input pins 16a and 16b remain as independent input pins.

Figure 4:
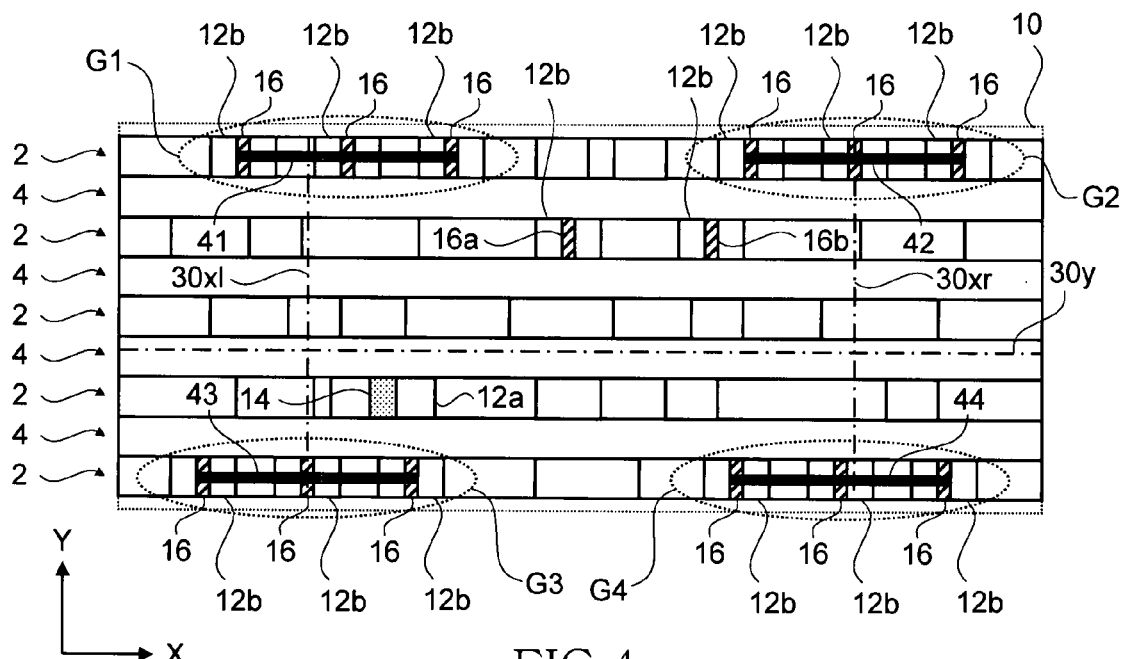
FIG. 4 is a schematic diagram showing the layout region to be automatically wired (a state that sub-trunk wirings are wired)

When the grouping of the input pins 16 is thus completed, sub-trunk wirings 41 to 44 that mutually connect the input pins 16 belonging to the same groups are hypothetically wired by the wiring position computing unit 112 for a sub-trunk wiring, as shown in FIG. 4 (step S14). As explained above, the term "hypothetically" used herein means that the wiring is not performed on an actual device, and the wiring positions are merely established in the design apparatus 100.

As shown in FIG. 4, the sub-trunk wirings 41 to 44 are laid along the X direction, and the Y coordinates thereof are identical with the Y coordinates of the input pins 16 that configure the group. Left ends of the sub-trunk wirings 41 to 44 are set to the X coordinates of the input pins 16 positioned at the leftmost, out of the input pins included in the group. Right ends of the sub-trunk wirings 41 to 44 are set to the X coordinates of the input pins 16 positioned at the rightmost, out of the input pins included in the group.

Subsequently, by the wiring position computing unit 111 for a main trunk wiring, X coordinates 30xl and 30xr of the ends of the main trunk wiring 30 are calculated (step S15). The X coordinates 30xl and 30xr are obtained such that out of X coordinates of central portions of the respective sub-trunk wiring 41 to 44, X coordinates of the input pins 16a and 16b that do not belong to any group, and the X coordinate of the output pin 14, the X coordinate of which value is the minimum (positioned at the leftmost) and the X coordinate of which value is the maximum (positioned at the rightmost) are selected, and the selected values are defined as the X coordinates 30xl and 30xr of the ends of the main trunk wiring 30.

Figure 5:
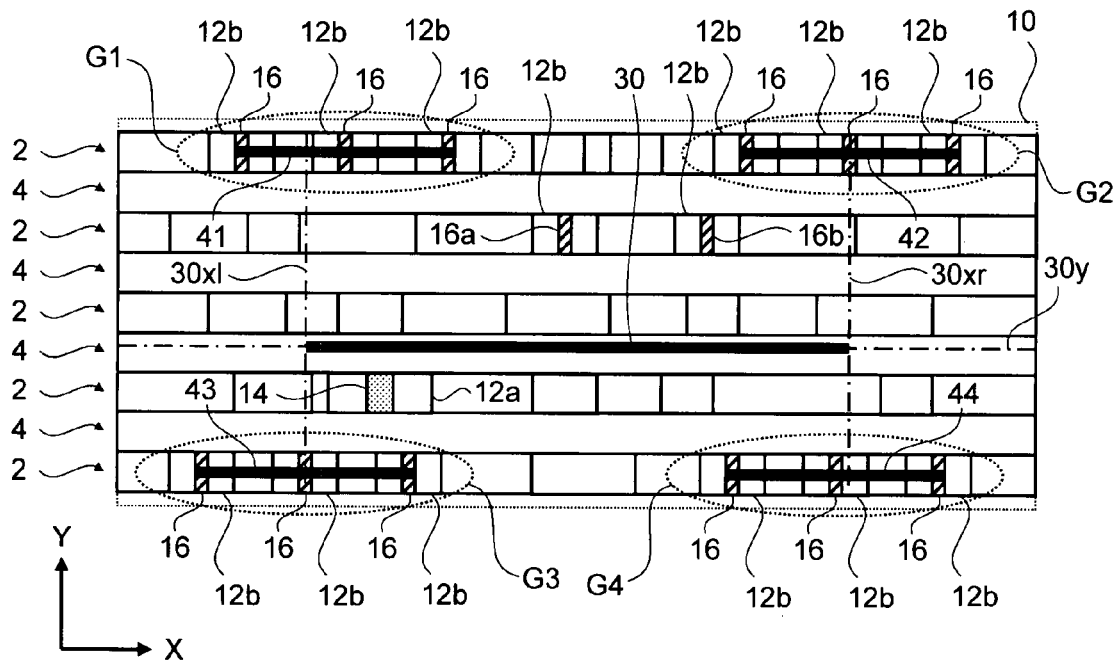
FIG. 5 is a schematic diagram showing the layout region to be automatically wired (a state that main-trunk wirings are wired)

Thus, the coordinates of the main trunk wiring 30 are established, so that the wiring position computing unit 111 for a main trunk wiring hypothetically wires the main trunk wiring 30 as shown in FIG. 5 (step S16). A wiring layer on which the main trunk wiring 30 is to be formed can be the same wiring layer as that on which sub-trunk wirings 41 to 44 are to be formed, and can be a different wiring layer. In the former, the number of wiring layers can be reduced, so that it becomes possible to achieve low cost. On the other hand, in the latter, the wiring layer is multiple-layered, so that a wiring efficiency can be enhanced. In the latter, in particular, the thickness of the wiring layer of the main trunk wiring 30 can be made larger than those of the sub-trunk wirings 41 to 44. In this case, it becomes possible to achieve low resistance of the main trunk wiring 30 where currents concentrate.

In practice, this process (steps S11 to S16) is performed on a plurality of nets. Thus, intervals between the main trunk wirings 30 corresponding to each net are sometimes too narrow, and in some cases, the main trunk wirings 30 are sometimes positioned to be short-circuited. In this case, the Y coordinates of some main trunk wirings 30 are increased or decreased for fine adjustment. Likewise, when such problems occur to the sub-trunk wirings 41 to 44, the Y coordinates of some sub-trunk wirings 41 to 44 are increased or decreased for fine adjustment. Such fine adjustment is performed by the wiring position computing units 111 and 112.

Figure 6:
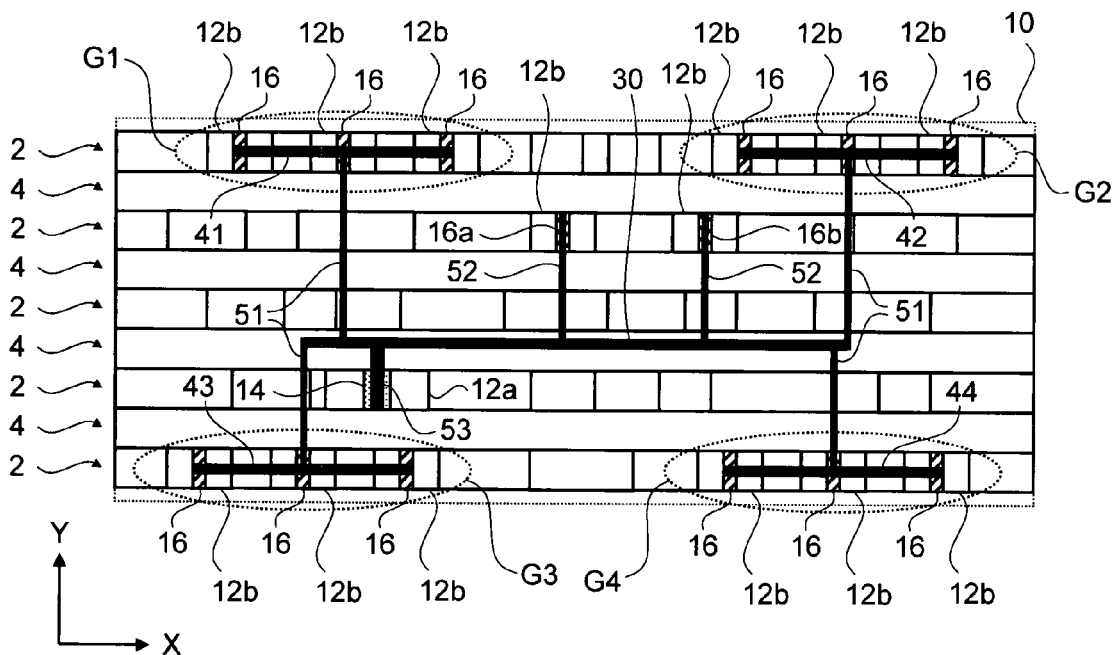
FIG. 6 is a schematic diagram showing the layout region to be automatically wired (a state after wiring)

Thereafter, as shown in FIG. 6, by the wiring position computing unit 113 for a lead-in wiring, lead-in wirings 51 that connect the main trunk wiring 30 and all the sub-trunk wirings 41 to 44 are hypothetically wired in the X direction. Subsequently, lead-in wirings 52 and 53 that connect the main trunk wiring 30 and all the pins not grouped (the output pin 14 and the input pins 16a and 16b) are hypothetically wired in the X direction (step S17).

A wiring layer on which the main lead-in wirings 51 to 53 are to be formed needs to be different from that on which the main trunk wiring 30 or the sub-trunk wirings 41 to 44 are to be formed. At positions where the lead-in wirings 51 to 53 and the main trunk wiring 30 or the sub-trunk wirings 41 to 44 intersect, a through-hole electrode (not shown) that penetrates an interlayer insulting film is arranged to thereby short-circuit the both components.

A wiring width of the lead-in wiring 53 connected to the output pin 14 is set to be sufficiently large. The reason for that is already explained. Positions in the X direction of the lead-in wirings 51 are determined such that the lead-in wirings 51 are connected to the central portions of the corresponding sub-main trunk wirings 41 to 44.

Thus, the automatic wiring of the net is completed, and data indicative of each wiring position is outputted from the output unit 102. As explained above, in practice, the process (steps S11 to S17) is performed on the plurality of nets, and thereby, the automatic wirings for all the nets within the layout region 10 are completed.

Thus, according to the present embodiment, a plurality of input pins 16 close to each other are grouped, and these groups are mutually connected by the sub-trunk wirings 41 to 44, so that the number of lead-in wirings 51 laid in the X direction can be reduced. Thereby, when the number of nets is large relative to the area of the layout region 10, that is, even when the area of the layout region 10 is narrow relative to the number of nets, the possibility of generating nets where the automatic wiring is impossible is greatly reduced. Accordingly, in the design apparatus 100 for a semiconductor integrated circuit according to the present embodiment, it is possible to efficiently perform automatic wiring on a circuit of which layout region is small in area, and where multiple-layering of a wiring region is difficult, like a peripheral circuit of a semiconductor memory.

Further, when the position of the main trunk wiring 30 in the Y direction is determined, the output pin 14 is imparted with weighting larger than the input pins 16. Thus, a distance between the main trunk wiring 30 and the output pin 14 in the Y direction can be shortened as compared to the conventional case. Thus, an output load of the circuit block 12*a* or output circuit can be reduced.

Figure 7:
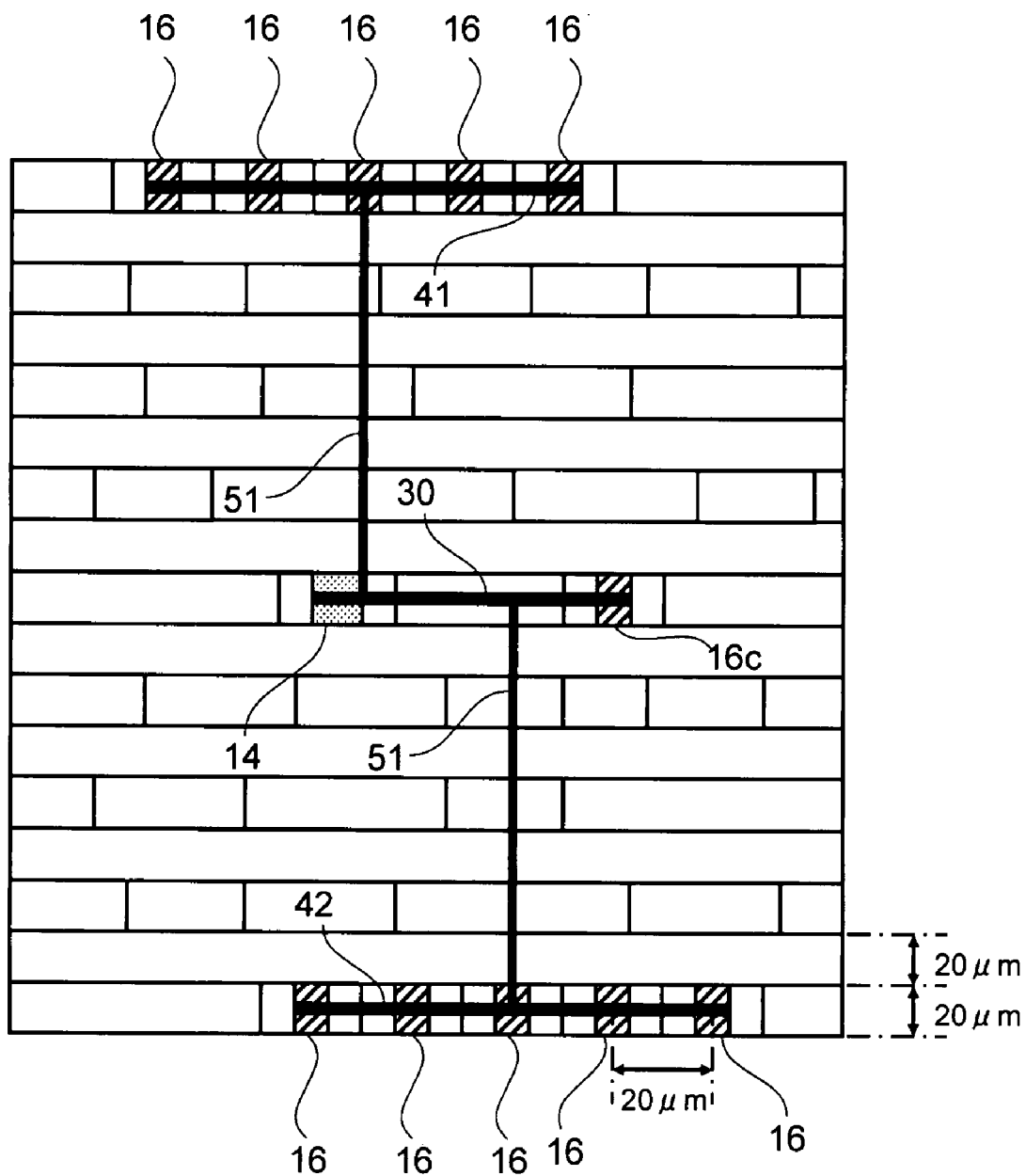
FIG. 7 is a schematic diagram showing another layout region wired according to a method of a preferred embodiment of the present invention.
Figure 8:
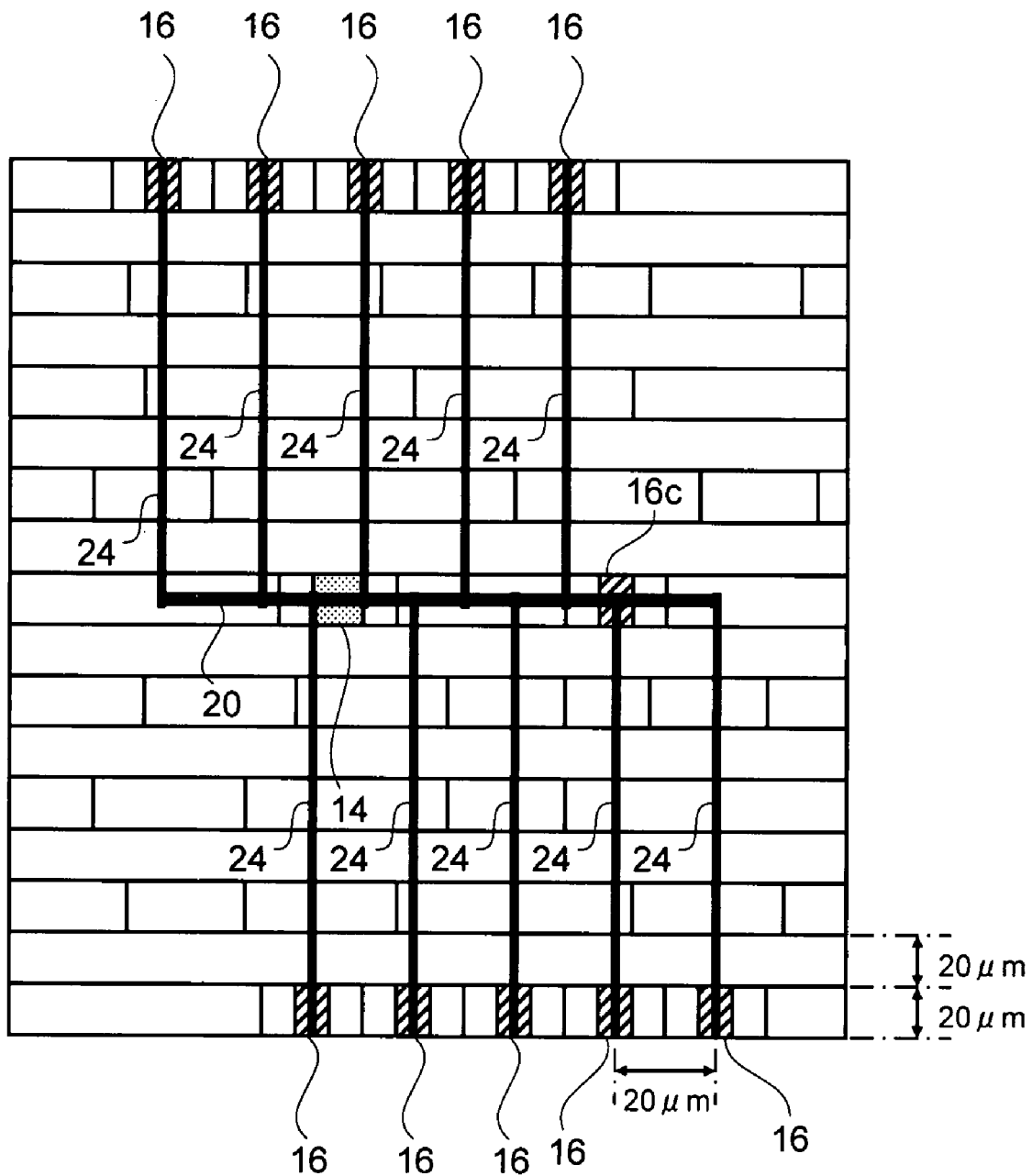
FIG. 8 is a schematic diagram showing an example where the layout region shown in FIG. 7 is wired according to a conventional method.

Further, according to the present embodiment, the total wiring length is shortened as compared to the conventional case. Thus, it becomes also possible to reduce a wiring capacity. The shortening effect of the total wiring length differs depending on the number of pins and the arrangement of the pins. However, when the shortening effect obtained from a layout shown in FIG. 7 is taken as an example, the total wiring length amounts to 535 μm, because in the present embodiment, the total wiring length in the X direction is 215 μm (=55 μm+8×20 μm), and the total wiring length in the Y direction is 320 μm (=8×2×20 μm). In contrast, when the automatic wiring is performed according to the conventional method, the total wiring length amounts to 1600 μm, because the total wiring length in the X direction is 100 μm and the total wiring length in the Y direction is 1500 μm (=7.5×10×20 μm), as shown in FIG. 8.

In this case, the total wiring length is reduced to about ⅓, so that the wiring capacity also results in being reduced to about ⅓ on the assumption that a wiring capacity parameter in the X direction and a wiring capacity parameter in the Y direction are approximately equal. Such an effect becomes more significant as the number of pins becomes large.

Figure 9:
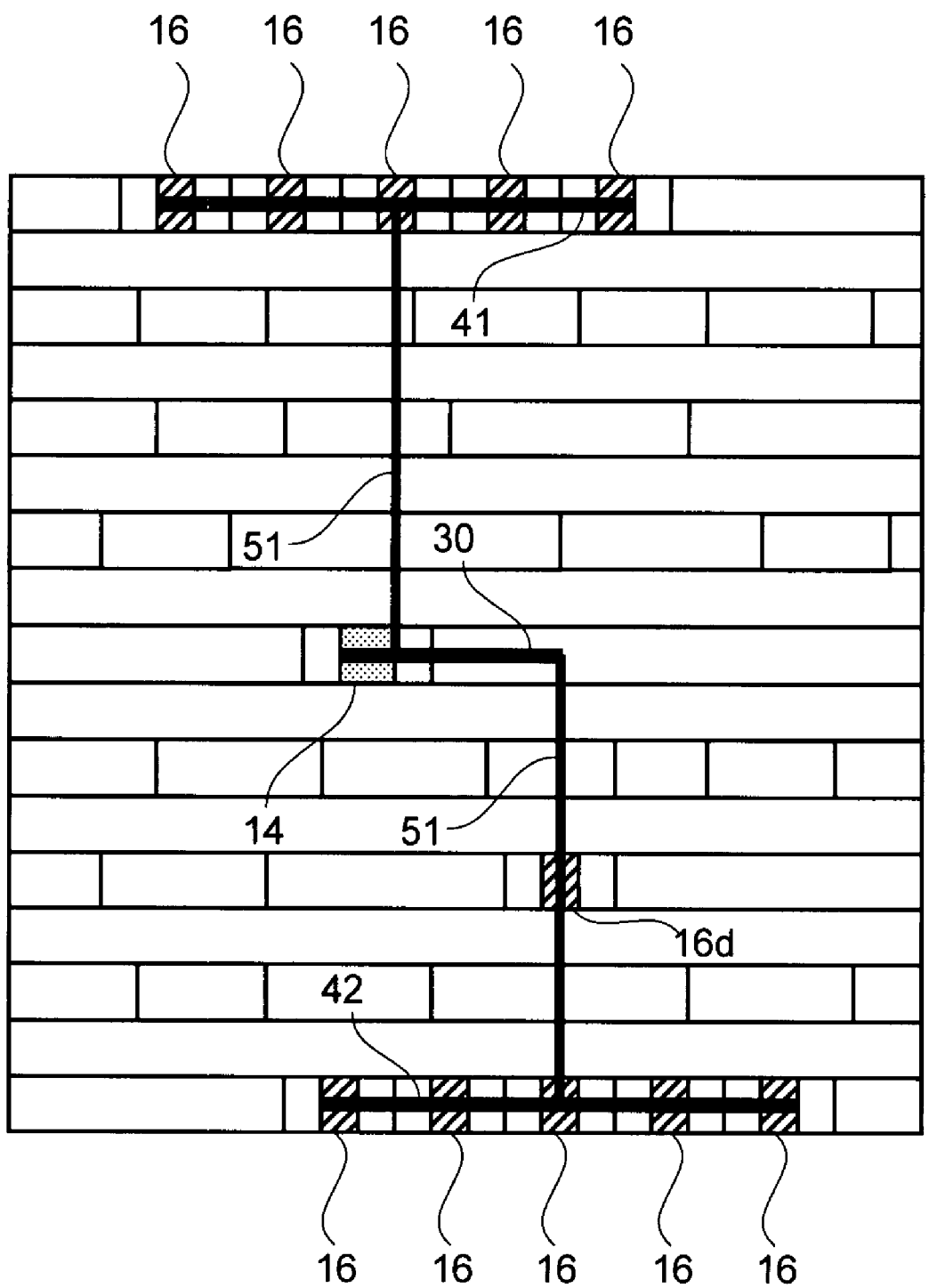
FIG. 9 is a schematic diagram showing an example of a layout region where lead-in wirings are rendered unnecessary.

Note that, in the case where an ungrouped input pin 16*c* exists in the laying position of the main trunk wiring 30, as in the example shown in FIG. 7, the lead-in wiring 52 (see FIG. 6) that connects the main trunk wiring 30 and the ungrouped input pin 16*c* are not necessary as is obvious. In the case where an ungrouped input pin 16*d* exists in the laying position of another lead-in wiring 51, as shown in FIG. 9, a dedicated lead-in wiring 52 is not necessary, either. That is, in the present invention, it is not required that the dedicated lead-in wiring 52 that connects the main trunk wiring 30 and the ungrouped input pin 16 be laid.

Figure 10:
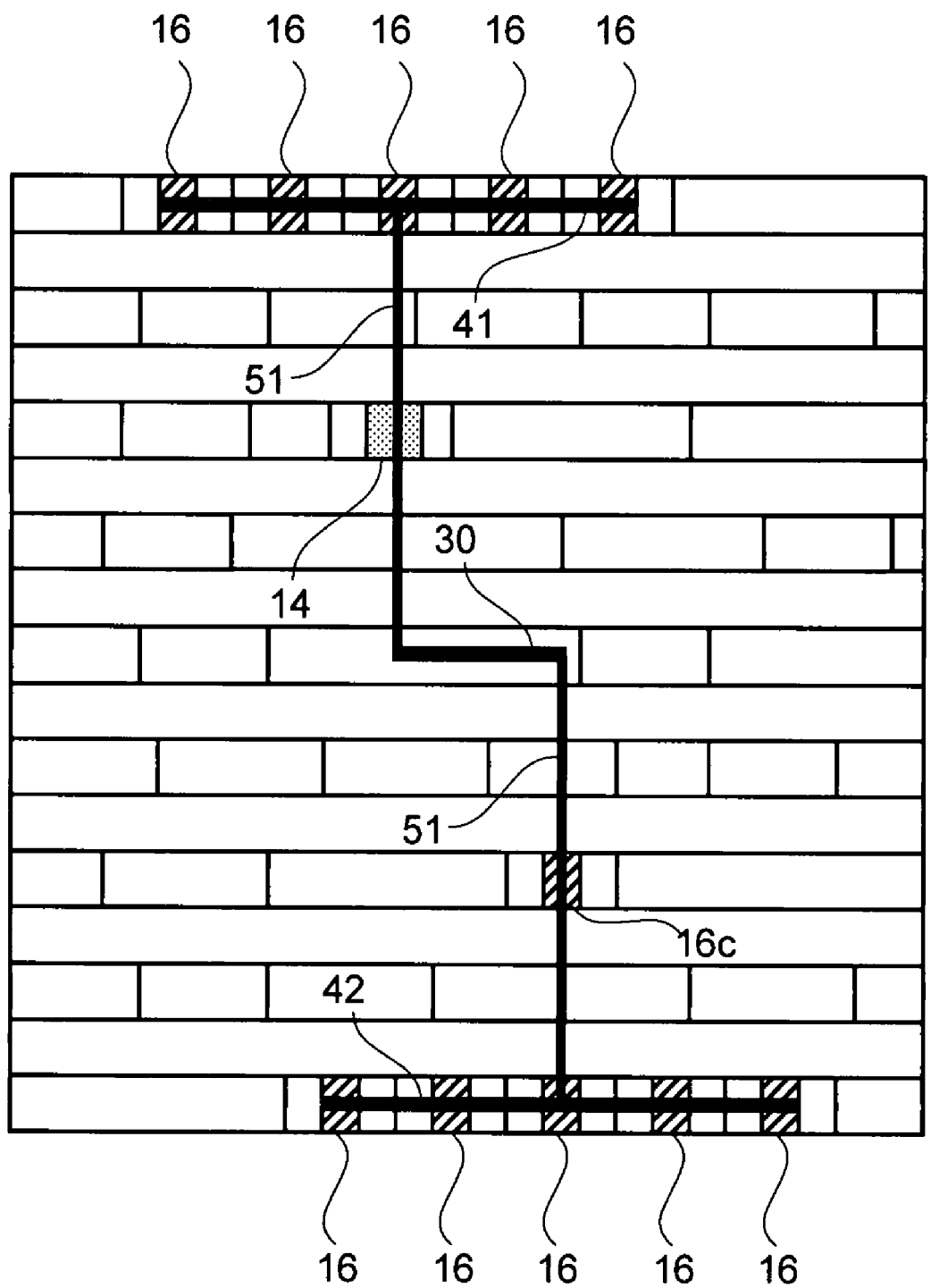
FIG. 10 is a schematic diagram showing another example of a layout region where lead-in wirings are rendered unnecessary.

Likewise, in the case where the output pin 14 exists in the laying position of the main trunk wiring 30, as in the example shown in FIG. 7, the lead-in wiring 53 (see FIG. 6) that connects the main trunk wiring 30 and the output pin 14 is not necessary as is obvious. In the case where the output pin 14 exists in the laying position of another lead-in wiring 51, as shown in FIG. 10, the dedicated lead-in wiring 53 is not necessary, either. That is, in the present invention, it is not required, either, that the dedicated lead-in wiring 53 that connects the main trunk wiring 30 and the output pin 14 be laid.

While the number of main trunk wiring is one in the present embodiment, the present invention is not limited thereto, and a plurality of main trunk wirings can be assigned to one net.

Figure 11:
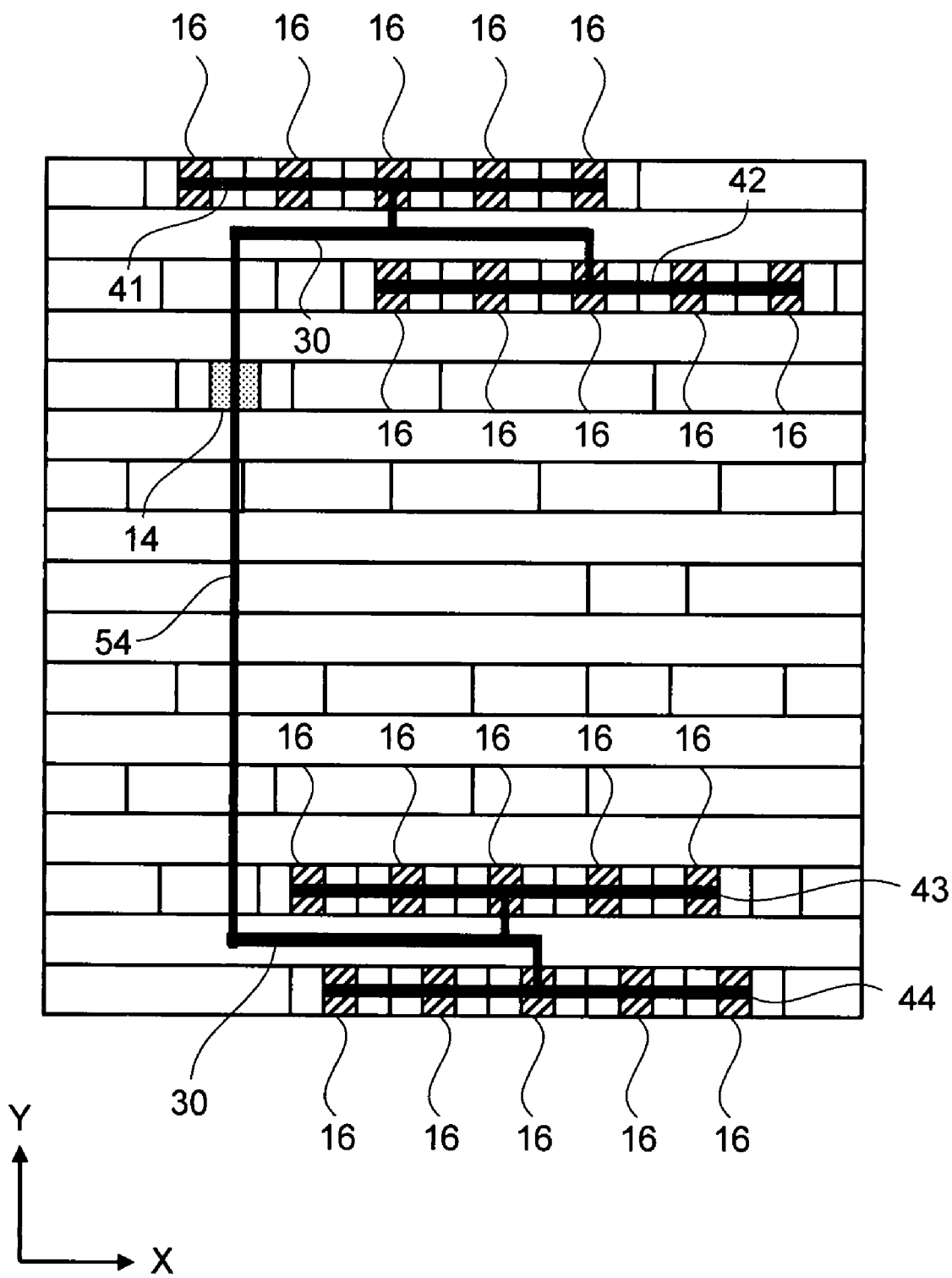
FIG. 11 is a schematic diagram showing an example where two main trunk wirings 30 are assigned to one net.

FIG. 11 is a schematic diagram showing an example where two main trunk wirings 30 are assigned to one net.

In the example shown in FIG. 11, there are intervals in a distribution of the input pins 16 in the Y direction, and there are two groups, that is, one group with large Y coordinates (positioned on an upper side), and the other group with small Y coordinates (positioned on a lower side). In such a case, when the average value of the Y coordinates is determined as the Y coordinate 30*y* of the main trunk wiring (see step S12), the position of the main trunk wiring 30 results in being distant from most of the input pins 16. As a result, the total length of the lead-in wirings becomes long. Thus, the wiring efficiency decreases or the wiring resistance increases.

To solve such problems, in the example shown in FIG. 11, the main trunk wirings 30 are assigned to both the group with large Y coordinates and the group with small Y coordinates. The two main trunk wirings 30 are mutually connected by a lead-in wiring 54. Thereby, the distance between the main trunk wirings 30 and the input pins 16 is shortened, so that the wiring efficiency increases and at the same time, the wiring resistance can be decreased.

Figure 12:
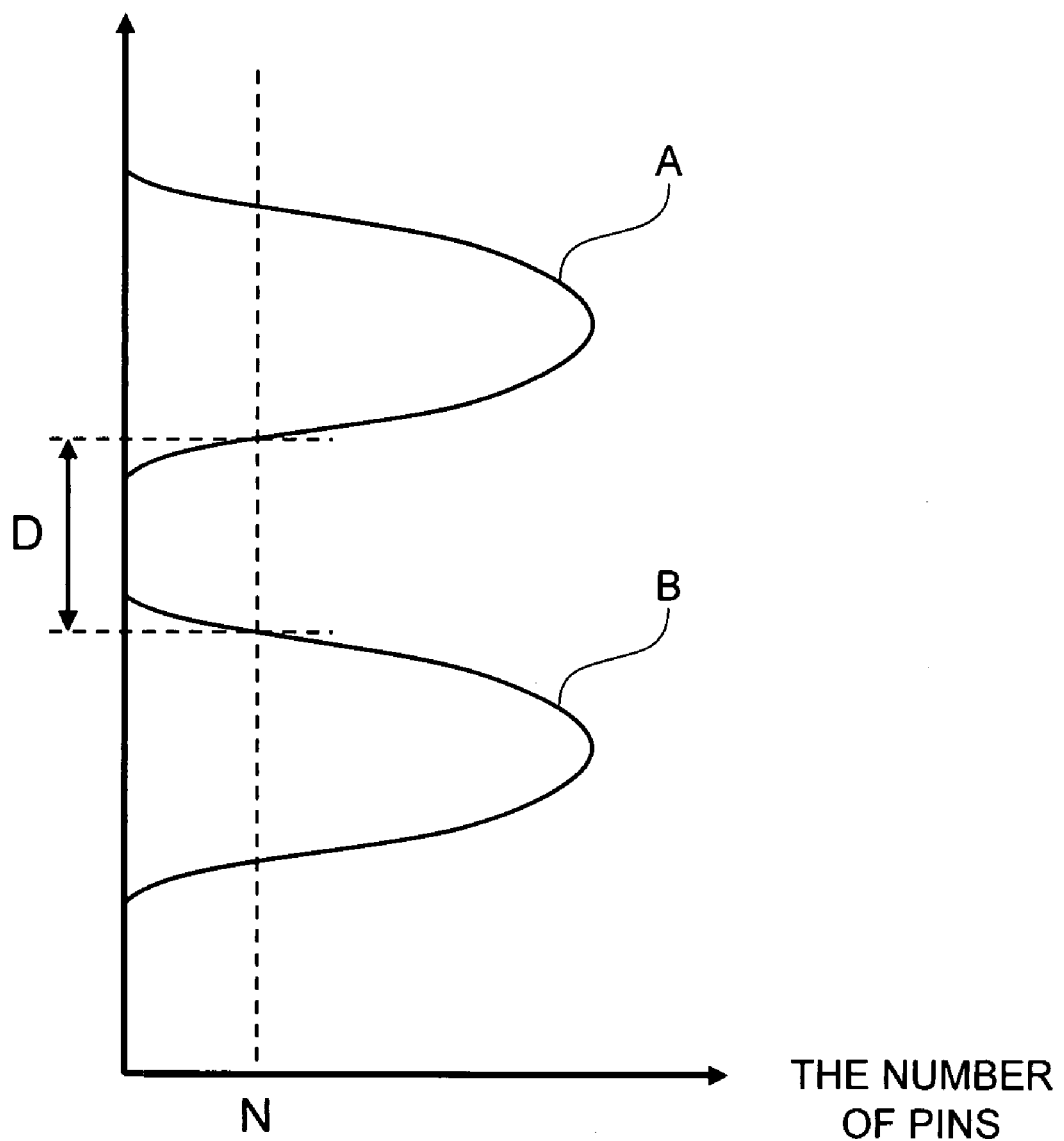
FIG. 12 is a diagram for explaining a method for determining the number of main trunk wirings.

The number of main trunk wirings 30 can be determined according to the following criterion. That is, as shown in FIG. 12, the distribution of the output pins 14 and the input pins 16 in the Y direction is checked to calculate a distance D between the two points of the Y coordinate where the number of pins is less than a threshold value N. As a result, when the distance D is longer than a predetermined length, it can be determined that there are large intervals in the distribution in the Y direction. Thus, the average value of the Y coordinates can be calculated by dividing into the group A with large Y coordinates and the group B with small Y coordinates.

Subsequently, a design method in the case where the input pins included in the same net have a hierarchical structure in tiers is explained.

Figure 13:
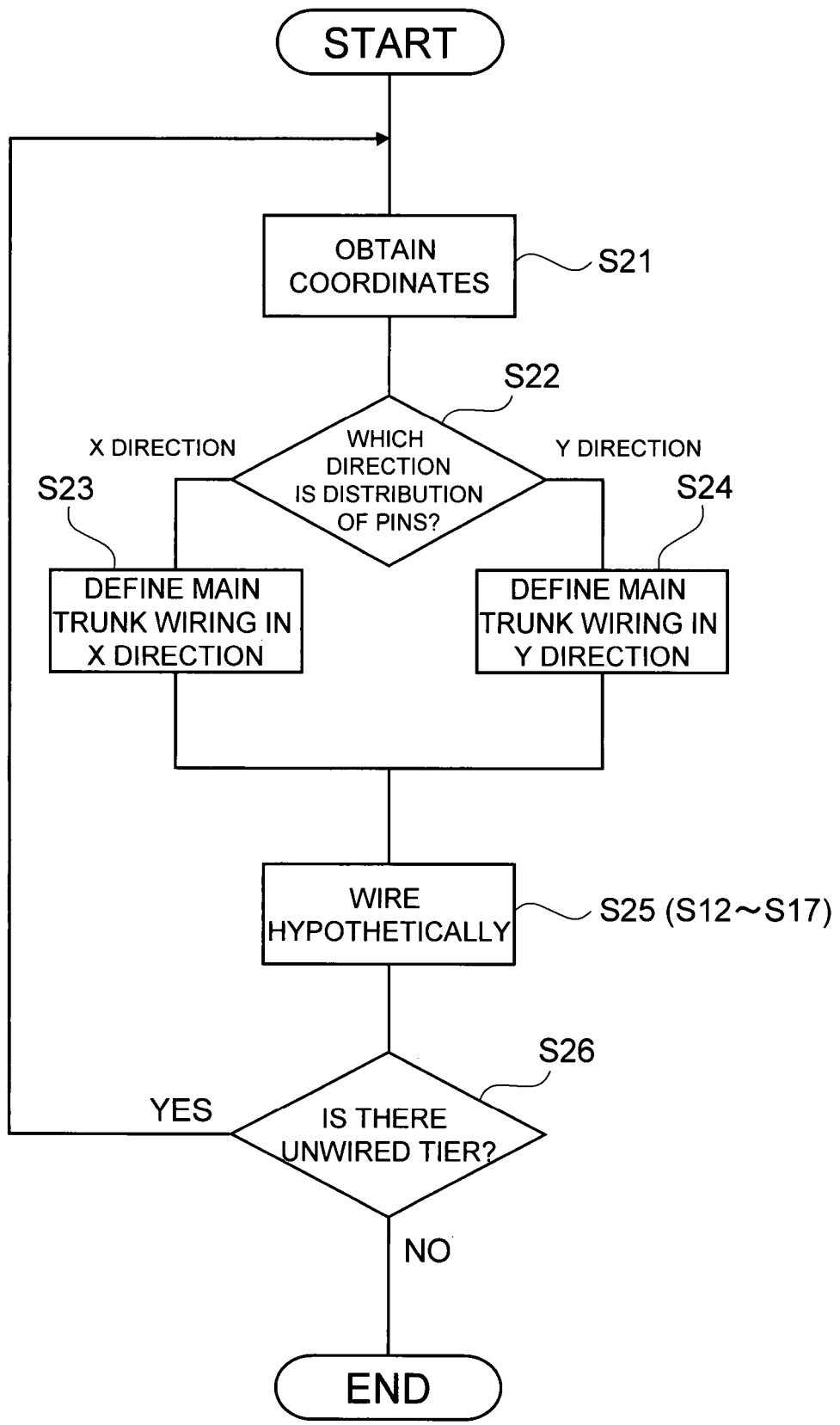
FIG. 13 is a flowchart showing an operation of the design apparatus shown in FIG. 1 in the case where the input pins have a hierarchical structure.
Figure 14:
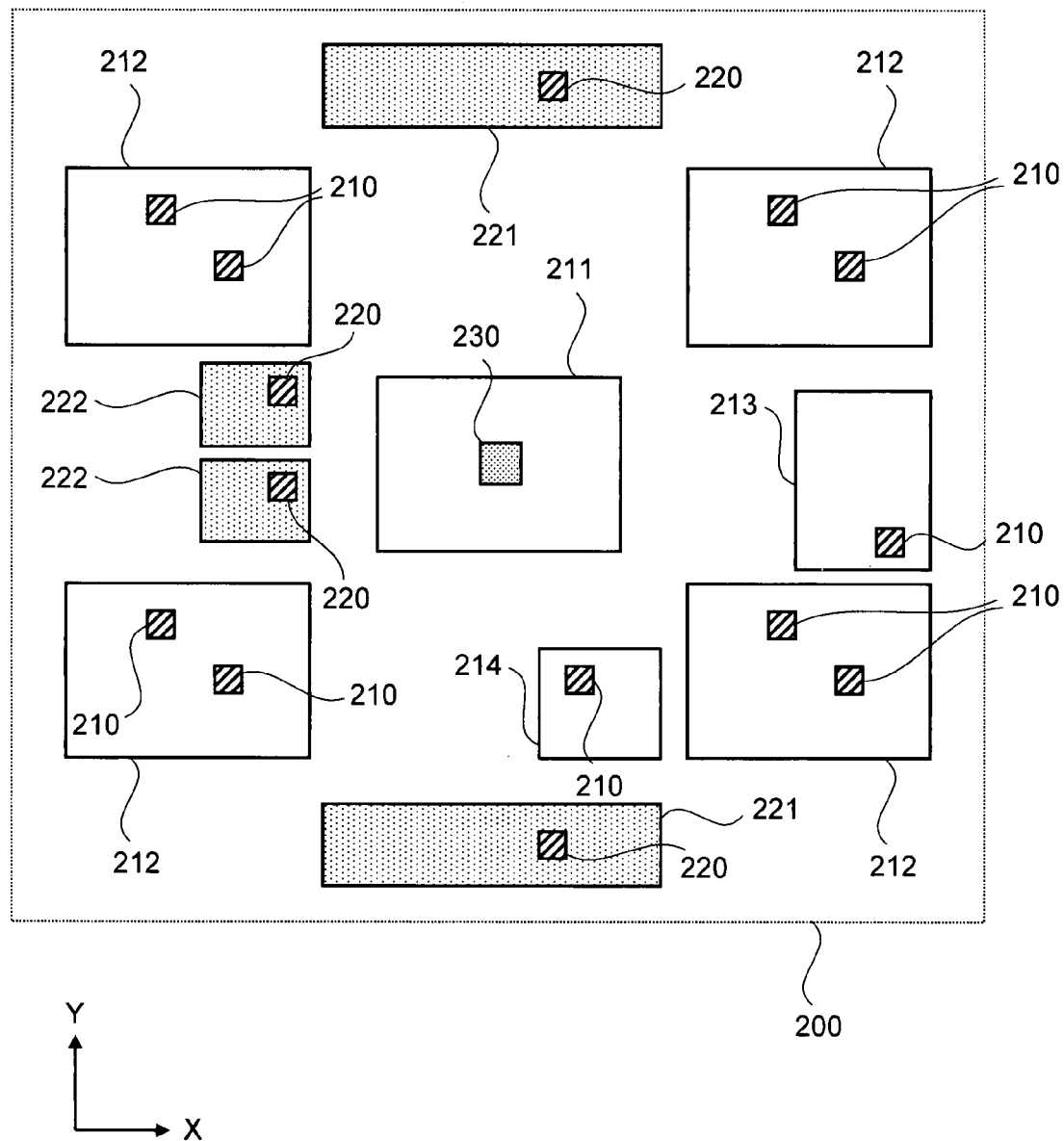
FIG. 14 is a schematic diagram showing a layout region to be automatically wired (a state before wiring)
Figure 15:
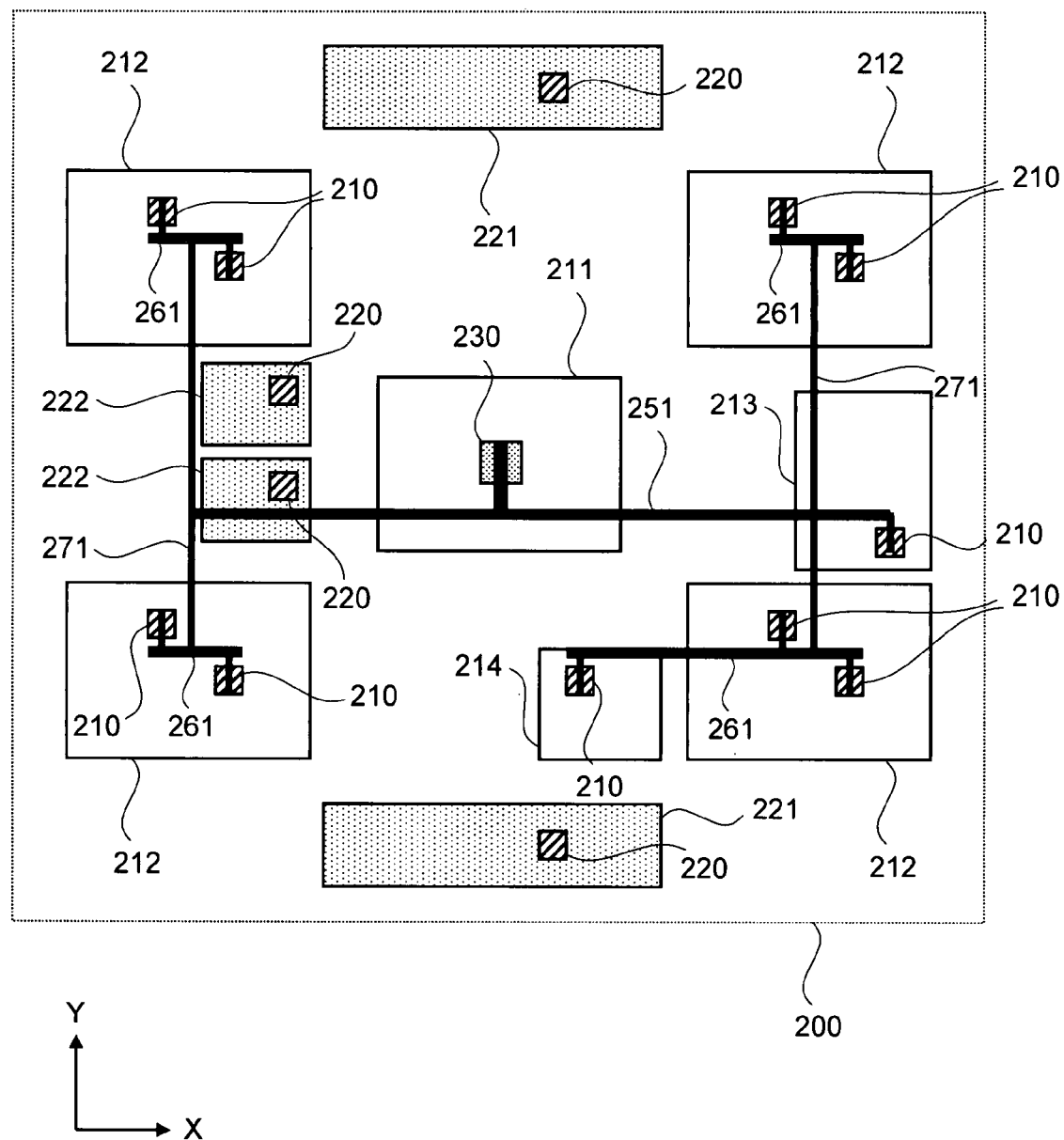
FIG. 15 is a schematic diagram showing the layout region to be automatically wired (in a state that a lower tier is wired)
Figure 16:
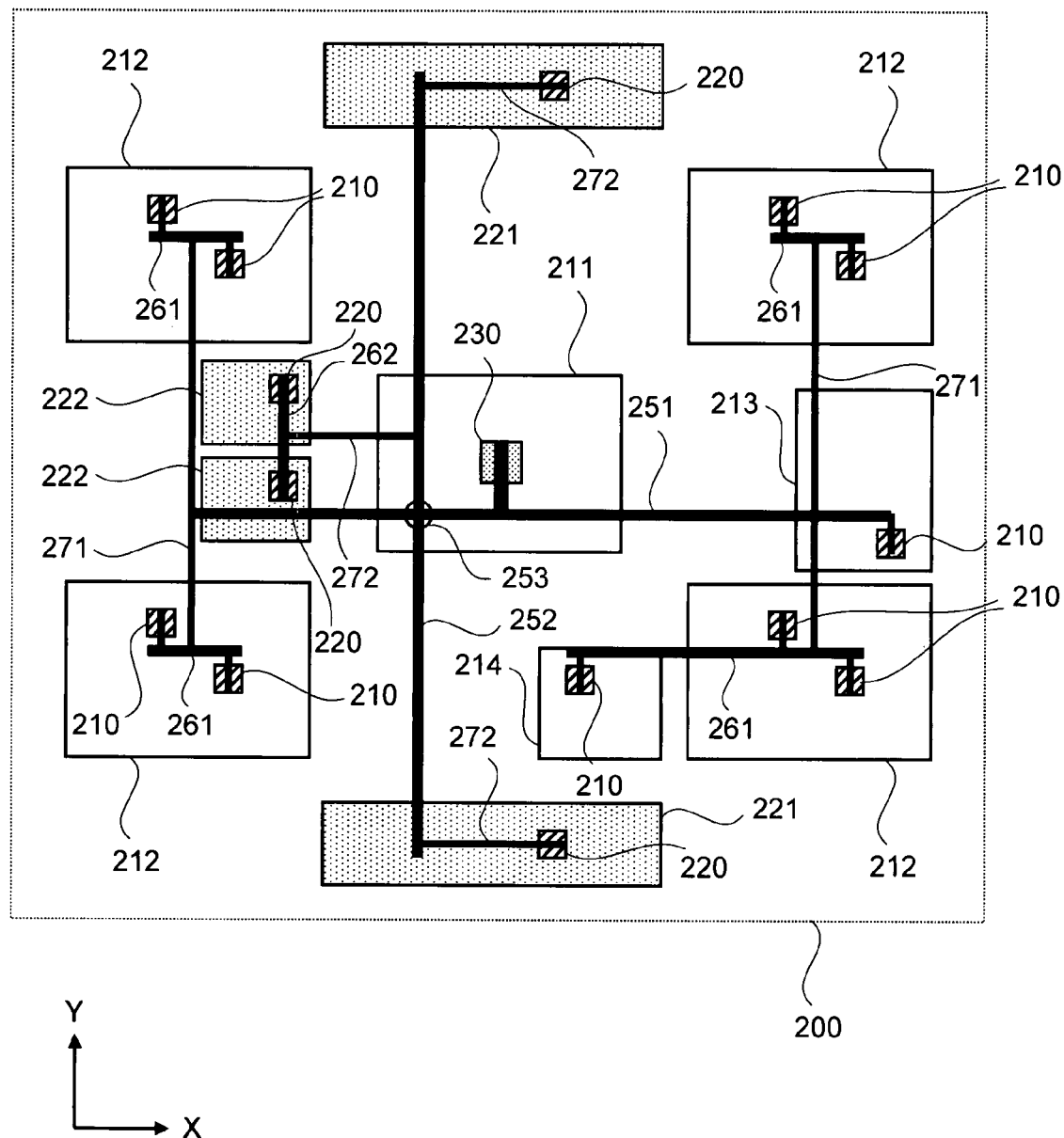
FIG. 16 is a schematic diagram showing the layout region to be automatically wired (in a state that a higher tier is wired)
Figure 17:
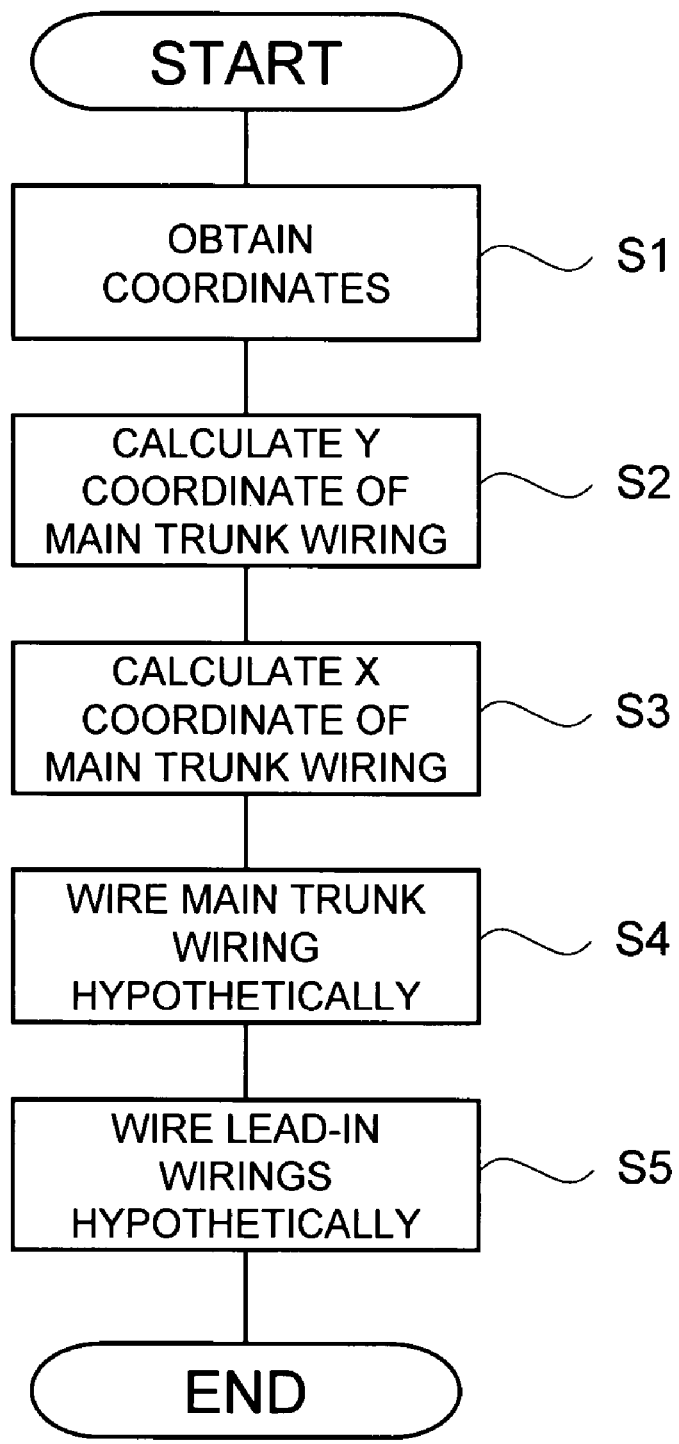
FIG. 17 is a flowchart for explaining an automatic wiring method by the conventional algorithm described above.
Figure 18:
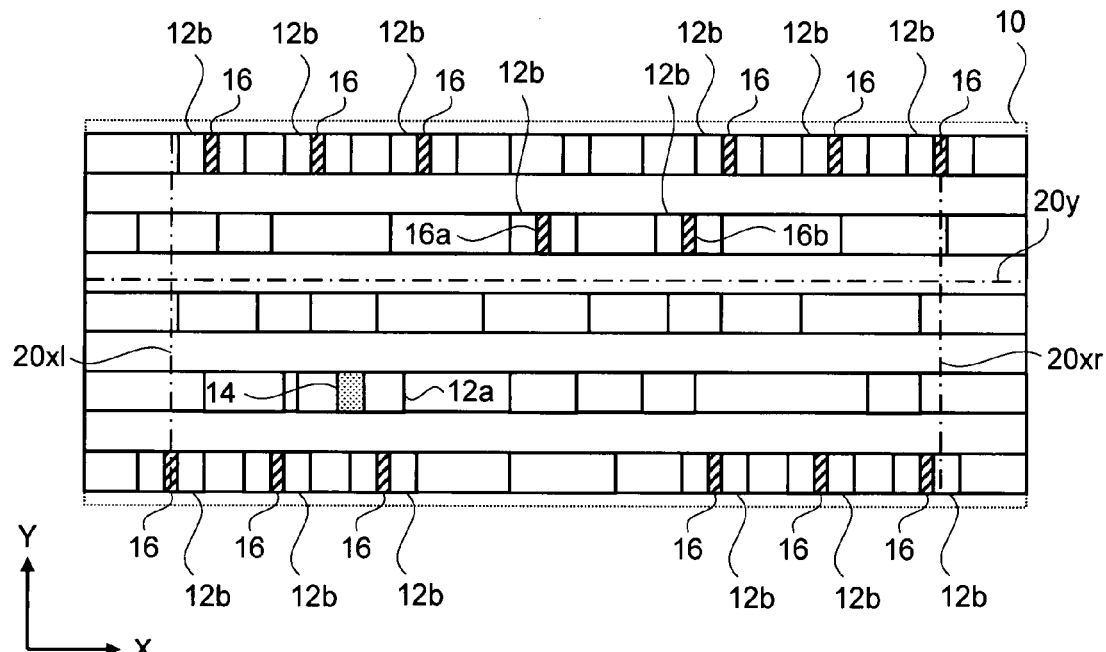
FIG. 18 is a schematic diagram showing a layout region to be automatically wired (a state before wiring)
Figure 19:
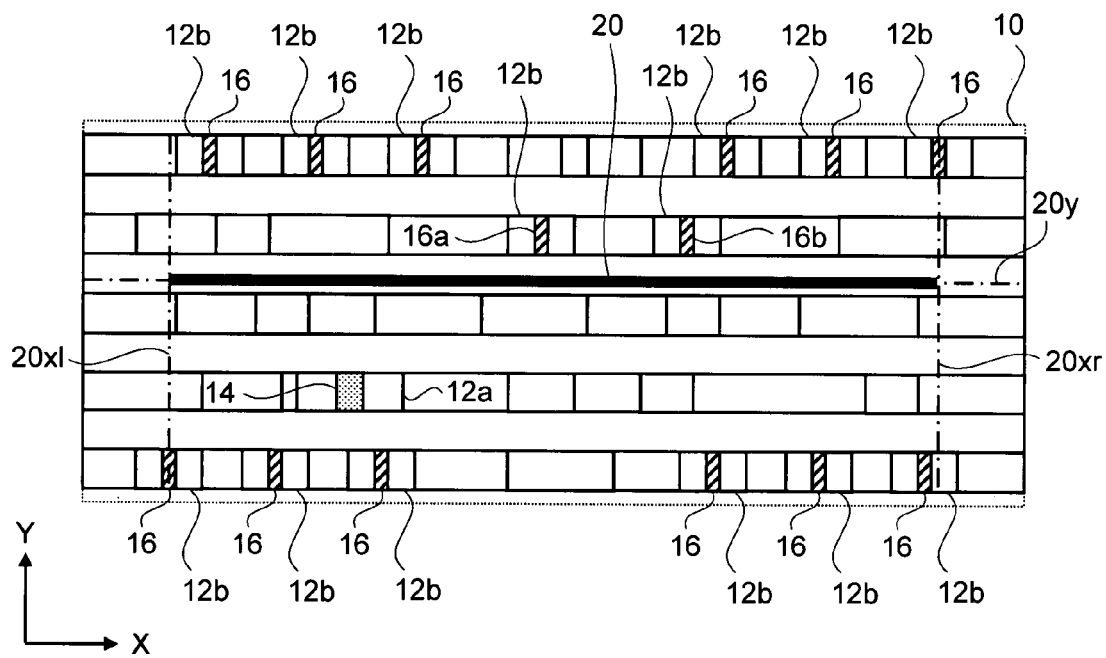
FIG. 19 is a schematic diagram showing the layout region to be automatically wired (in a state that a trunk wiring is wired)
Figure 20:
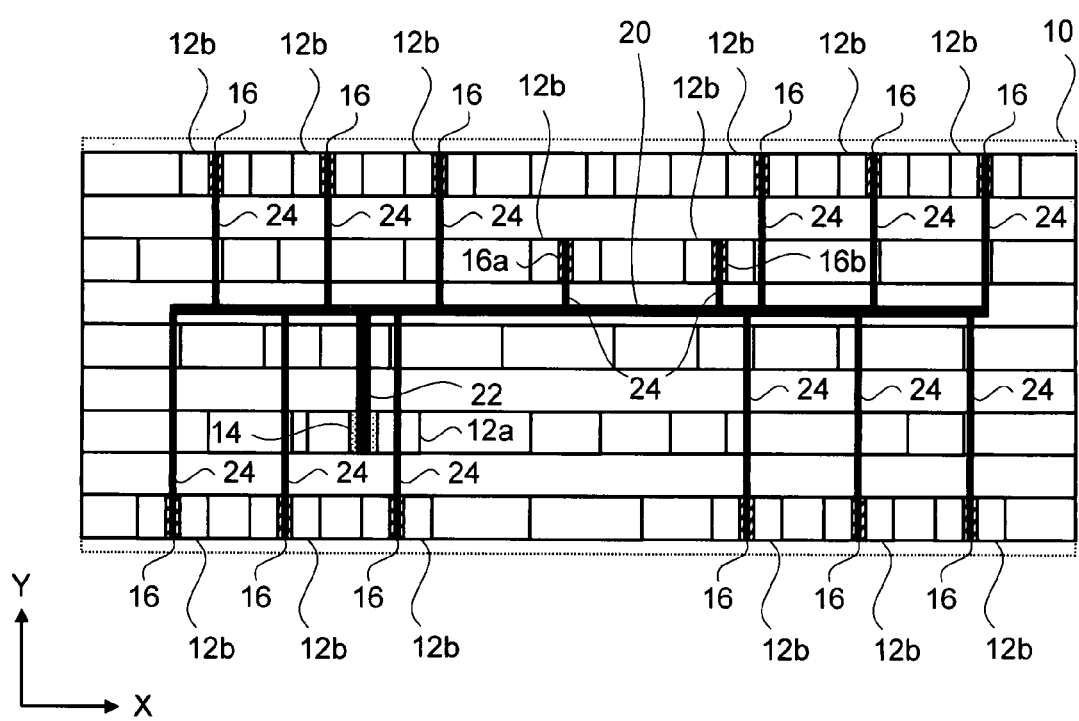
FIG. 20 is a schematic diagram showing the layout region to be automatically wired (a state after wiring).

FIG. 13 is a flowchart showing an operation of the design apparatus 100 in the case where the input pins have a hierarchical structure. FIG. 14 to FIG. 16 are schematic diagrams showing one example of the layout region 10 to be automatically wired. The term "hierarchical structure" used herein means that a priority in design is assigned to the wirings between the circuit blocks, and does not indicate physical upper and lower portions of the wiring layer. An example of the "hierarchical structure" includes a case where it is needed that after the wiring position of a lower-level circuit block is established, the wiring position of a higher-level circuit block is determined.

As shown in FIG. 14, a layout region 200 according to this example includes cell groups 211 to 214 assigned to a lower level and cell groups 221 and 222 assigned to a higher level. The lower-level cell groups 212 to 214 each include input pins 210, and the higher-level cell groups 221 and 222 each include input pins 220. The lower-level cell group 211 includes an output pin 230. These input pins 210 and 220, and the output pin 230 belong to the same net. The design apparatus 100 automatically calculates positions of wirings that mutually connect the pins that belong to the same net.

In this case, although a number of other nets exist in the layout region 200, the explanation is given by focusing on only a net comprised of the input pins 210 and 220 and the output pin 230 in the interest of clearer understanding.

Firstly, X coordinates and Y coordinates of the input pins 210 and the output pin 230 that belong to the lower-level cell groups 211 to 214, out of the input pins 210, 220 and the output pin 230 existing within the layout region 200 are obtained (step S21). Subsequently, the distribution of the obtained X coordinates and Y coordinates is analyzed to determine whether these coordinates are widely distributed in the X direction or in the Y direction (step S22).

As a result of the analysis, when it is determined that the coordinates are widely distributed in the X direction (step S22: X direction), an extending direction of the main trunk wiring is set in the X direction (step S23). When it is determined that the coordinates are widely distributed in the Y direction (step S22: Y direction), the extending direction of the main trunk wiring is set in the Y direction (step S24) In the layout region 200 shown in FIG. 14, the pins 210 and 230 that belong to the lower-level cell groups 211 to 214 are widely distributed in the X direction. Thus, the extending direction of the main trunk wiring is set in the X direction.

Subsequently, a wiring process similar to that of the steps S12 to S17 shown in FIG. 2 is performed to determine positions of a main trunk wiring 251, sub-trunk wirings 261, lead-in wirings 271, as shown in FIG. 15. Thereby, a hypothetical wiring regarding the lower-level cell groups is completed (step S25). When the extending direction of the main trunk wiring is set in the Y direction, a wiring process can be performed by reversing the X direction and the Y direction at the steps S12 to S17 shown in FIG. 2.

As shown in FIG. 15, the two input pins 210 included in the same cell group 212 are grouped. Although the Y coordinates of these two input pins 210 do not completely agree, the respective Y coordinates are close, and the distance therebetween is closer than the distance to the Y coordinate of the main trunk wiring 251. Thus, these two input pins 210 are grouped. In this manner, it is not necessary that the respective Y coordinates of the input pins grouped in the present invention completely agree.

In practice, the process is performed on a plurality of nets, so that fine adjustment is performed such that short-circuit with another net does not occur by optionally increasing and decreasing the coordinates of the main trunk wiring 251 and the sub main trunks 261. In this case, it is necessary to check all tiers of the other nets so that short-circuit does not occur.

Subsequently, it is determined whether a tier not wired on a higher level exists (step S26). When such a tier exists (step S26: YES), the process returns to the step S21 to obtain the X coordinates and the Y coordinates of the input pins 220 that belong to the higher-level cell groups 221 and 222. Thereafter, the above process is performed to determine the positions of a main trunk wiring 252, sub-trunk wirings 262, and lead-in wirings 272, as shown in FIG. 16.

In the layout region 200, since the pins that belong to the higher-level cell groups 221 and 222 are widely distributed in the Y direction, the extending direction of the main trunk wiring 252 and the sub-trunk wirings 262 is set in the Y direction, as shown in FIG. 16. In this case, the lower-level main trunk wiring 251 and the higher-level main trunk wiring 252 are preferably formed on different wiring layers. For example, the higher-level lead-in wirings 272 can be formed on a wiring layer where the lower-level main trunk wiring 251 and the sub-trunk wirings 261 are formed; and the higher-level main trunk wiring 252 and the sub-trunk wirings 262 can be formed on a layer where the lower-level lead-in wirings 271 are formed. In this case, at an intersection 253 of the main trunk wiring 251 and the main trunk wiring 252, a through-hole electrode that penetrates an interlayer insulating film is arranged to thereby to short-circuit the both components.

Subsequently, when it is determined that the automatic wirings for all the tiers are completed (step S26: NO), a series of processes are completed.

Thus, when the input pins included in the same net have a hierarchical structure, the automatic wirings for all the tiers can be completed by sequentially performing the automatic wiring from a lower tier. Further, the distribution of the pins is analyzed for each tier, and the extending direction of the main trunk wiring is determined based thereon, so that the high wiring efficiency can be obtained.

The present invention is in no way limited to the aforementioned embodiments, but rather various modifications are possible within the scope of the invention as recited in the claims, and naturally these modifications are included within the scope of the invention.

For example, the definition of the X direction and the Y direction in the present invention is relative, so that these directions do not indicate absolute directions.

The criterion for grouping a plurality of pins is not particularly limited. In addition to the criterion as in the present embodiment, that is, the criterion in which grouped are pins of which Y coordinates are mutually identical or close, and distances therebetween are shorter than those to the Y coordinate of the main trunk wiring, a criterion in which automatically grouped are pins of which distances therebetween are shorter than the distance previously determined can be adopted.

What is claimed is:

1. A method for forming a semiconductor integrated circuit, comprising:
    a first step of defining a coordinate of a main trunk wiring, using a main trunk wiring computing unit, which passes on an output pin or adjacent to the output pin, according to weighted coordinates of both the output pin and a plurality of input pins, the input pins being assigned a first weighting, the output pin being assigned a second weighting that is larger than the first weighting;
    a second step of grouping the plurality of the input pins, using an input pin computing unit, into a plurality of groups, referring to coordinates of the main trunk wiring as a standard point;
    a third step of defining sub-trunk wirings, using a sub-trunk wiring computing unit, connecting the input pins with each other that belong to a same group; and
    a fourth step of defining first lead-in wirings, using a lead in wire computing unit, connecting at least the main trunk wiring and the sub-trunk wirings.

2. The design method for a semiconductor integrated circuit as claimed in claim 1, wherein the second weighting is a product of the first weighting and a number of the input pins.

3. The design method for a semiconductor integrated circuit as claimed in claim 1, wherein the second step is performed by grouping the input pins positioned close to each other.

4. The design method for a semiconductor integrated circuit as claimed in claim 3, wherein the second step is performed by grouping the input pins arranged on a straight line or close to the straight line.

5. The design method for a semiconductor integrated circuit as claimed in claim 1, wherein the fourth step further defines a second lead-in wiring connecting the input pins that do not belong to any group and the main trunk wiring.

6. The design method for a semiconductor integrated circuit as claimed in claim 1, wherein the fourth step further defines a third lead-in wiring connecting the output pin and the main trunk wiring.

7. The design method for a semiconductor integrated circuit as claimed in claim 6, wherein a wiring width of the third lead-in wiring is set to be wider than the wiring width of the first lead-in wiring.

8. The design method for a semiconductor integrated circuit as claimed in claim 1, wherein the sub-trunk wirings and the main trunk wiring extends in an X direction and the first lead-in wiring defined at the fourth step extends in a Y direction substantially orthogonal to the X direction.

9. The design method for a semiconductor integrated circuit as claimed in claim 8, wherein determination of a position of the main trunk wiring in the Y direction at the first step is performed based on coordinates of the Y directions of at least the input pins and the output pin.

10. The design method for a semiconductor integrated circuit as claimed in claim 8, wherein determination of positions of ends of the main trunk wiring at the first step is performed at least based on center coordinates of the sub-trunk wirings in the X.

11. The design method for a semiconductor integrated circuit as claimed in claim 8, wherein at the first step, a plural number of the main trunk wirings are defined according to distribution of the input pins in the Y direction.

12. The design method for a semiconductor integrated circuit as claimed in claim 1, wherein the input pins have a hierarchical structure, and the first to fourth steps are performed by each tier.

13. The design method for a semiconductor integrated circuit as claimed in claim 12, wherein an extending direction of a main trunk wiring corresponding to a predetermined tier and an extending direction of a main trunk wiring corresponding to a different tier are different from each other.

14. The design method for a semiconductor integrated circuit as claimed in claim 1, wherein an extending direction of the main trunk wiring is set based on distribution of at least the input pins.

15. A design apparatus for a semiconductor integrated circuit, comprising:
a coordinate obtaining unit that obtains coordinates of both a plurality of input pins included in a same net and an output pin to be connected in common to the input pins;
a first wiring-position computing unit that determines positions of main trunk wiring which passes on the output pin or adjacent to the output pin, according to weighted coordinates of both the output pin and the plurality of input pins, the input pins being assigned a first weighting, the output pin being assigned a second weighting that is larger than the first weighting;
a grouping unit that groups the plurality of input pins, referring to the coordinates of the main trunk wiring as a standard point;
a second wiring-position computing unit that determines a position of a sub trunk wiring connecting the input pins with each other that belongs to a same group; and
a third wiring-position computing unit that determines a position of lead-in wirings connecting the main trunk wiring and the sub-trunk wirings.

16. The design apparatus for a semiconductor integrated circuit as claimed in claim 15, wherein the grouping unit groups the input pins positioned close to each other.

17. The design apparatus for a semiconductor integrated circuit as claimed in claim 16, wherein the grouping unit groups the input pins arranged in a straight line or close to the straight line.

18. A method comprising:
providing a coordinate of an output pin and coordinates of a plurality of input pins;
defining a coordinate of a main trunk wiring, using a main trunk wiring computing unit, relative to the output pin in response to the coordinates of the output pin and the input pins;
grouping the input pins, using an input pin computing unit, into a plurality of groups in response to the coordinate of the main trunk wiring;
defining a plurality of sub-trunk wirings, using a sub-trunk wiring computing unit, each interconnecting the input pins with each other that belong to an associated one of the groups; and
defining a set of lead-in wirings, using a lead in wire computing unit, each connecting the main trunk wiring and an associated one of the sub-trunk wirings.

19. The method as claimed in claim 18, wherein the input pins are assigned a first weighting and the output pin is assigned a second weighting that is larger than the first weight, the defining the coordinate of the main trunk wiring being carried out in response to the first weighting and the second weighting.

* * * * *